(12) United States Patent
Seo

(10) Patent No.: US 6,680,637 B2
(45) Date of Patent: Jan. 20, 2004

(54) PHASE SPLITTER CIRCUIT WITH CLOCK DUTY/SKEW CORRECTION FUNCTION

(75) Inventor: Hee-Young Seo, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/241,449

(22) Filed: Sep. 12, 2002

(65) Prior Publication Data

US 2003/0111705 A1 Jun. 19, 2003

(30) Foreign Application Priority Data

Dec. 18, 2001 (KR) ........................................ 2001-80484

(51) Int. Cl.[7] .............................................. H03K 3/017
(52) U.S. Cl. ........................................ 327/175; 327/172
(58) Field of Search ................................. 327/170, 171, 327/172, 173, 174, 175, 292, 293, 295, 141, 155

(56) References Cited

U.S. PATENT DOCUMENTS

| | | | |
|---|---|---|---|
| 4,926,447 A | * | 5/1990 | Corsetto et al. ............ 375/376 |
| 5,572,158 A | * | 11/1996 | Lee et al. .................... 327/175 |
| 5,874,845 A | | 2/1999 | Hynes ......................... 327/259 |
| 5,945,857 A | * | 8/1999 | Havens ........................ 327/175 |
| 5,945,862 A | * | 8/1999 | Donnelly et al. ........... 327/278 |
| 6,084,452 A | * | 7/2000 | Drost et al. ................. 327/175 |
| 6,169,434 B1 | * | 1/2001 | Portmann ................... 327/175 |
| 6,292,042 B1 | | 9/2001 | Kim et al. ................... 327/257 |

FOREIGN PATENT DOCUMENTS

KR        1998-023059        7/1998

\* cited by examiner

*Primary Examiner*—Timothy P. Callahan
*Assistant Examiner*—Cassandra Cox
(74) *Attorney, Agent, or Firm*—Volentine Francos PLLC

(57) ABSTRACT

A phase splitter circuit includes a first signal transfer path for receiving an input signal to output a first output signal, a second signal transfer path for receiving the input signal to output a second output signal having an inverted phase of the first output signal, and a duty cycle correction circuit for controlling pull-up and pull-down speeds of the first and second signal transfer paths to the opposite direction in response to the first and second output signals. According to this structure, duty cycles of the first and second output signals approach 50% and a skew or delay time therebetween approaches "0."

28 Claims, 16 Drawing Sheets

PHASE SPLITTER CIRCUIT WITH CLOCK DUTY/SKEW CORRECTION FUNCTION

CROSS-REFERENCES TO RELATED APPLICATIONS

This application relies for priority upon Korean Patent Application No. 2001-80484, filed on Dec. 18, 2001, the contents of which are herein incorporated by reference in their entirety.

FIELD

The present invention relates to semiconductor integrated circuits and, more particularly, to a phase splitter circuit for effectively correcting a duty cycle of a clock signal.

BACKGROUND

It is well known that a phase splitter circuit receives one input signal (e.g., a clock or data signal) to output two output signals (e.g., clock or data signals) having a phase difference of 180°. Such a phase splitter circuit has been used to control, for example, a switch of a pipeline, a double data rate signaling, and a transmission gate circuit. Output signals of an ideal phase splitter circuit have a 50% duty cycle, respectively. No skew exists between the output signals of the ideal phase splitter. Here the "skew" means a delay time difference between output signals.

Examples of a phase splitter circuit are disclosed in U.S. Pat. No. 5,874,845 entitled "NON-OVERLAPPING CLOCK PHASE SPLITTER", U.S. Pat. No. 6,292,042 entitled "PHASE SPLITTER", and Korea Laid-Open Patent Publication No. 1998-023059 entitled "ODD NUMBER DIVIDER CIRCUIT."

A well-known phase splitter circuit has two signal paths (or signal transmission paths) that are constructed to generate a pair of clock signals. One of the two signal paths includes an odd number of inverters, and the other includes an even number of inverters. One clock signal is concurrently applied to both signal paths of the phase splitter circuit. For example, as shown in FIG. 1, a first signal path includes two inverters INV1 and INV2 and outputs a first output signal OUT having the same phase as an input signal IN. A second signal path includes three inverters INV3, INV4, and INV5 and outputs a second output signal OUTN having a phase difference of 180° with respect to the input signal IN. Each of the inverters constituting respective signal paths may comprise PMOS and NMOS transistors that are connected by a manner well known in the art.

In case of the phase splitter circuit shown in FIG. 1, the circuit construction is so simple that the layout area is small and the power consumption is low. However, the phase splitter circuit is easily influenced by noise resulting from the parasitic load (illustrated as a resistance element and a capacitance element in FIG. 1) or noise resulting from process, voltage, and temperature variations (hereinafter referred to as "PVT" variation). More specifically, as the PVT condition is changed, pull-up and pull-down characteristics of construction components of the phase splitter circuit are changed. Thus, a duty cycle of respective output signals OUT and OUTN of the phase splitter circuit, or a skew between the output signals OUT and OUTN, may be changed. Further, as the parasitic load is changed, the duty cycle of the respective output signals OUT and OUTN of the phase splitter circuit, or the skew between the output signals OUT and OUTN, may be changed. In case of the phase splitter circuit shown in FIG. 1, when the duty cycle and the skew are changed, a changed duty cycle of an output signal, and a changed skew between the output signals OUT and OUTN, cannot be corrected into a required value.

SUMMARY

An object of the present invention is to provide a phase splitter circuit capable of securing a stable duty cycle for the change of a parasitic load and a PVT condition.

Another object of the invention is to provide a phase splitter circuit capable of suppressing a duty cycle change and a skew noise that are caused by a change of the parasitic load and/or the PVT condition.

Yet another object of the invention is to provide a phase splitter circuit capable of correcting duty cycle and skew with the use of output data.

Still another feature of the invention is to provide a phase splitter circuit capable of securing a stable duty cycle even though the duty cycle of the input signal is changed.

According to one aspect of the invention, a phase splitter circuit includes first and second signal transfer paths and a duty cycle correction circuit. The first signal transfer path receives an input signal to output a first output signal, and a second signal transfer path receives the input signal to output a second output signal with an inverted phase with respect to the first output signal. The duty cycle correction circuit operates responsive to the first and second output signals. The duty cycle correction circuit controls pull-up and pull-down speeds of the first and second signal transfer paths in the opposite directions in response to the first and second output signals, so that each of the first and second output signals has a half duty cycle when a duty cycle of the input signal or of the respective first and second output signals deviates from the half duty cycle.

In an embodiment, the first signal transfer path comprises first and second inverters that are serially coupled between the input signal and the first output signal, and the second signal transfer path comprises third, fourth, and fifth inverters that are serially coupled between the input signal and the second output signal.

In an embodiment, the duty cycle correction circuit charges or discharges a control node in response to the first and second output signals. Pull-up and pull-down speeds of the first inverter are adjusted according to a potential of the control node, and pull-up and pull-down speeds of the fourth inverter are adjusted according to an inverted potential of the control node.

In an embodiment, the duty cycle correction circuit adjusts the pull-up speed of the first inverter in an increasing direction, and adjusts the pull-down speed of the first inverter in a decreasing direction, when the potential of the control node is relatively decreased to a previous potential thereof. Further, the duty cycle correction circuit adjusts the pull-up speed of the fourth inverter in a decreasing direction and the pull-down speed of the fourth inverter in an increasing direction, when the inverted potential of the control node is relatively increased to a previous potential thereof.

In this embodiment, the first and fourth inverters each comprise a stack inverter having first pull-up and pull-down transistors controlled by the potential of the control node, and second pull-up and pull-down transistors controlled by an input signal of the corresponding inverter.

In this embodiment, when a potential of the control node is relatively decreased and the input signal transitions from a low level to a high level, a high-to-low transition of an output signal of the first inverter becomes relatively slower. When a potential of the control node is relatively decreased and the input signal transitions from the high level to the low level, a low-to-high transition of the output signal of the first inverter becomes relatively faster.

In this embodiment, when an inverted potential of the control node is relatively increased and an input signal of the fourth inverter transitions from a high level to a low level, a low-to-high transition of an output signal of the fourth inverter becomes relatively slower. When the inverted potential of the control node is relatively decreased and the input signal of the fourth inverter transitions from the low level to the high level, a high-to-low transition of the output signal of the fourth inverter becomes relatively faster.

In this embodiment, the duty cycle correction circuit comprises a pull-up transistor for pulling up the control node in response to the first output signal, a pull-down transistor for pulling down the control node in response to an inverted version of the second output signal, a feedback capacitor coupled between the control node and a ground voltage, and an inverting amplifier for inverting a potential of the control node to output the inverted potential of the control node.

According to another aspect of the invention, a phase splitter circuit includes a first stack inverter for inverting an input signal, a first inverter for inverting an output signal of the first stack inverter to output a first output signal, a second inverter for inverting the input signal, a second stack inverter for inverting an output signal of the second inverter, a third inverter for inverting an output signal of the second stack inverter to output a second output signal, and a duty cycle correction circuit for controlling the first and second stack inverters in response to the first and second output signals. The duty cycle correction circuit controls pull-up and pull-down speeds of the first and second stack inverters in opposite directions in response to the first and second output signals so that each of the first and second output signals has a half duty cycle when a duty cycle of the input signal, or of the respective first and second output signals deviates from the half duty cycle.

According to yet another aspect of the invention, a phase splitter includes a first stack inverter for inverting an input signal, a first inverter for inverting an output signal of the first stack inverter to output a first output signal, a second stack inverter for inverting the input signal, a second inverter for inverting an output signal of the second stack inverter, a third inverter for inverting an output signal of the second inverter to output a second output signal, and a duty cycle correction circuit for controlling the first and second stack inverters in response to the first and second output signals. The duty cycle correction circuit controls pull-up and pull-down speeds of the first and second stack inverters in opposite directions in response to the first and second output signals so that each of the first and second output signals has a half duty cycle when a duty cycle of the input signal or of the respective first and second output signals deviates from the half duty cycle.

According to still another aspect of the invention, a phase splitter circuit includes a first stack inverter for inverting an input signal, a first inverter for inverting an output signal of the first stack inverter to output a first output signal, a second inverter for inverting the input signal, a second stack inverter for inverting an output signal of the second inverter, a third inverter for inverting an output signal of the second stack inverter to output a second output signal, and a duty cycle correction circuit for controlling the first and second stack inverters in response to either one of the first and second output signals. The duty cycle correction circuit controls pull-up and pull-down speeds of the first and second stack inverters in the opposite direction in response to either one of the first and second output signals so that each of the first and second output signals has a half duty cycle when a duty cycle of the input signal or of the respective first and second output signals deviates from the half duty cycle.

In a further aspect of the invention, a phase splitter circuit includes a first stack inverter for inverting an input signal, a first inverter for inverting an output signal of the first stack inverter to output a first output signal, a second stack inverter for inverting the input signal, a second inverter for inverting an output signal of the second stack inverter, a third inverter for inverting an output signal of the second inverter to output a second output signal, and a duty cycle correction circuit for controlling the first and second stack inverters in response to either one of the first and second output signals. The duty cycle correction circuit controls pull-up and pull-down speeds of the first and second stack inverters in the opposite direction in response to either one of the first and second output signals so that each of the first and second output signals has a half duty cycle when a duty cycle of the input signal or of the respective first and second output signals deviates from the half duty cycle.

DETAILED DESCRIPTION

Figure 1:
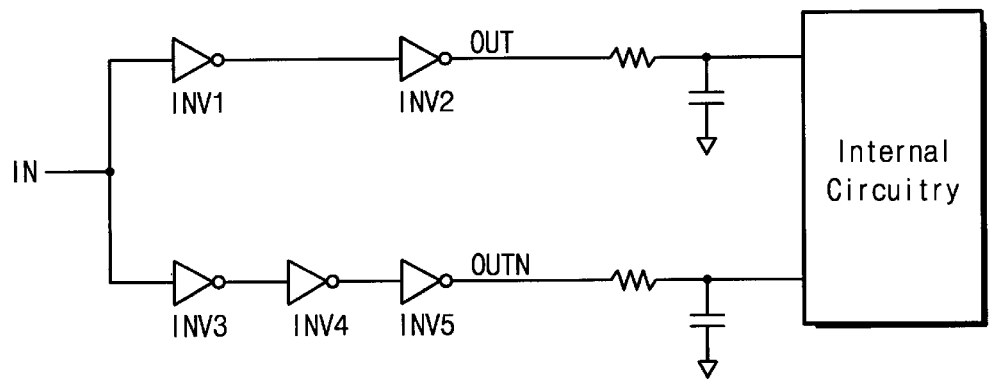
FIG. 1 is a circuit diagram of a conventional phase splitter circuit.
Figure 2:
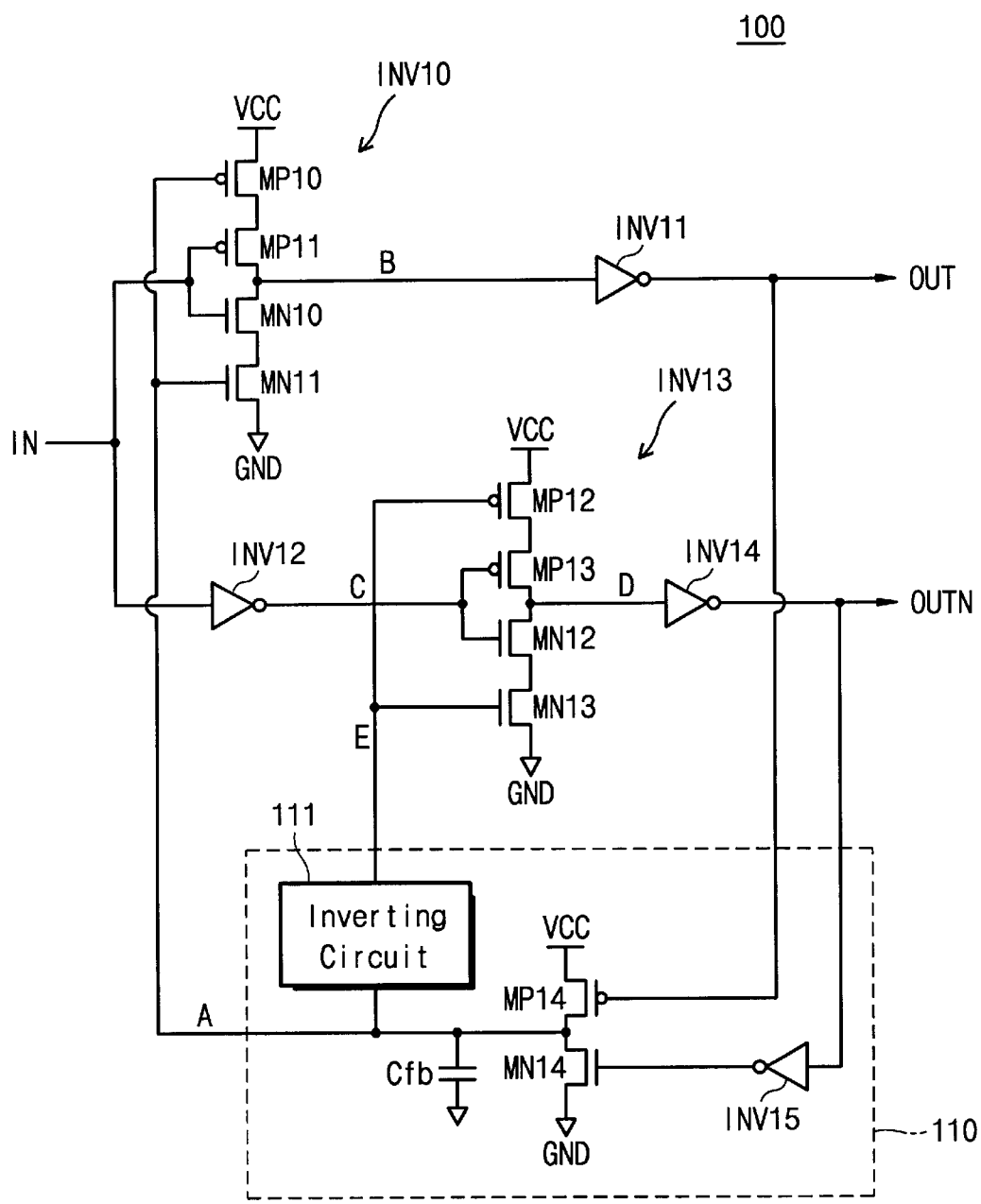
FIG. 2 is a circuit diagram of a phase splitter circuit according to a first embodiment.

A circuit diagram of a phase splitter circuit according to a first embodiment is illustrated in FIG. 2.

Referring to FIG. 2, a phase splitter circuit 100 includes a first signal transfer path, a second signal transfer path, and a duty cycle correction circuit 110. The first signal transfer path receives an input signal IN to output a first output signal OUT, and the second signal transfer path receives the input signal IN to output a second output signal OUTN. The first signal transfer path has inverters INV10 and INV11 that are serially coupled between the input signal IN and the output signal OUT. The second signal transfer path has inverters INV12, INV13, and INV14 that are serially coupled between the input signal IN and the output signal OUTN.

In the first embodiment, the inverter INV10 may be comprised of a stack inverter, and the inverter INV11 may be comprised of PMOS and NMOS transistors that are coupled according to a well-known manner. The inverter INV10 includes two pull-up transistors or PMOS transistors MP10 and MP11 and two pull-down transistors or NMOS transistors MN10 and MN11. The PMOS transistors MP10 and MP11 are serially coupled between a power supply voltage VCC and an output terminal B. The NMOS transistors MN10 and MN11 are serially coupled between the output terminal B and a ground voltage GND. The PMOS and NMOS transistors MP10 and MN11 are commonly connected to a control node A of the duty cycle connection circuit 110. The PMOS and NMOS transistors MP11 and MN10 are connected to commonly receive the input signal IN. The inverter INV13 may be comprised of a stack inverter, and each of the inverters INV12 and INV14 may be comprised of PMOS and NMOS transistors that are coupled according to a well-known manner. The inverter INV13 includes two pull-up transistors or PMOS transistors MP12 and MP13 and two pull-down transistors or NMOS transistors MN12 and MN13. The PMOS transistors MP12 and MP13 are serially coupled between the power supply voltage VCC and an output terminal D. The NMOS transistors MN12 and MN13 are serially coupled between the output terminal D and the ground voltage GND. The PMOS and NMOS transistors MP12 and MN13 are commonly connected to a control node E of the duty cycle correction circuit 110. The PMOS and NMOS transistors MP13 and MN12 are coupled to commonly receive an input signal C.

The duty cycle correction circuit 110 controls pull-up and pull-down speeds (or rising and falling slopes) of the stack inverters INV10 and INV13 of the first and second signal transfer paths in response to the first and second output signals OUT and OUTN. In case of the present invention, when a duty cycle of the input signal IN deviates from a 50% duty cycle and duty cycles of the output signals OUT and OUTN deviate therefrom, a changed duty cycle of an output signal is automatically corrected by the duty cycle correction circuit 110 so as to achieve the 50% duty cycle. This will be explained in detail below.

Figure 3:
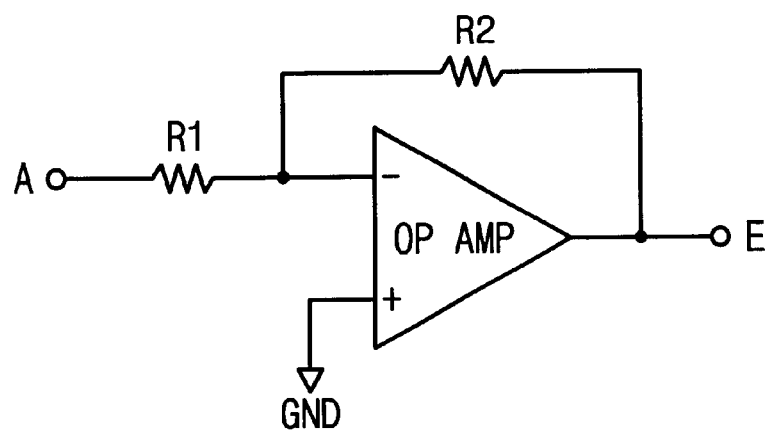
FIG. 3 is a circuit diagram for showing a preferred embodiment of an inverting circuit shown in FIG. 2.

The duty cycle correction circuit 10 includes a pull-up or PMOS transistor MP14, a pull-down or NMOS transistor MN14, an inverter INV15, a feedback capacitor Cfb, and an inverting circuit 111. The pull-up transistor MP14 is coupled between a power supply voltage VCC and a control node A and is controlled by the first output signal OUT. The pull-down transistor MN14 is coupled between the control node A and the ground voltage GND and is controlled by the second output signal OUTN that is transferred via the inverter INV15. The feedback capacitor Cfb is coupled between the control node A and the ground voltage GND. The inverting circuit 111 includes two resistors R1 and R2 and one operational amplifier OP AMP, which are connected as shown in FIG. 3. It is well known that the inverting circuit 111 inverts a potential of the control node A and transfers the inverted version of the potential to a control node E. As a result, symmetric voltage waveforms are obtained at the control nodes A and E (see FIG. 4 and FIG. 6).

Figure 4:
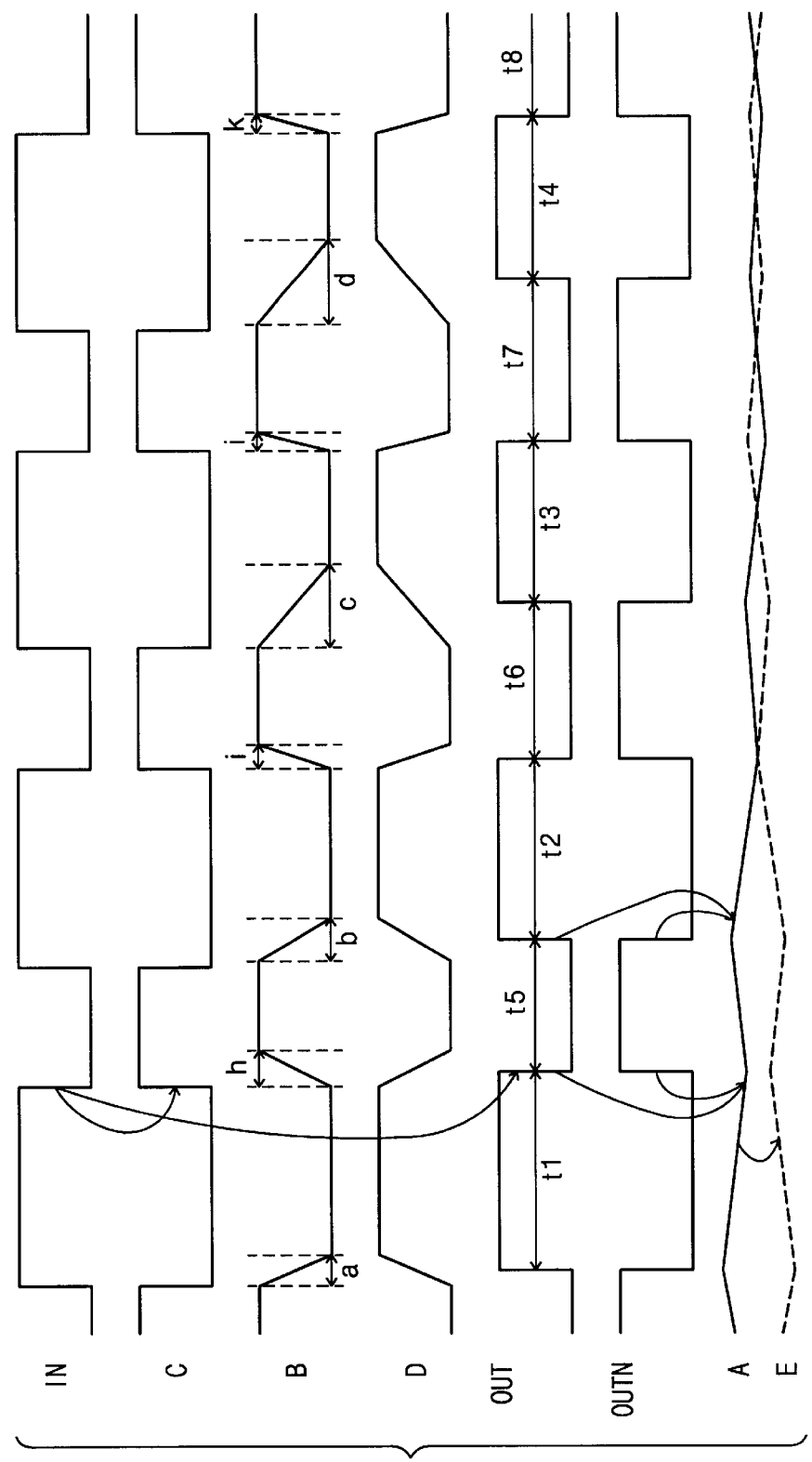
FIG. 4 is a timing diagram for explaining the steps of adjusting a duty cycle of an output signal when the duty cycle of the input signal is changed.

FIG. 4 illustrates a timing diagram for explaining the steps of adjusting the duty cycle of an output signal when the duty cycle of the input signal is changed. The operations of the phase splitter circuit will now be described more fully hereinafter with reference to the attached drawings.

Before explaining the operations of the phase splitter circuit, basically, when the potential of the control node is reduced, a pull-up operation becomes fast and a pull-down operation becomes slow. For example, when the potential of the control node A is reduced, the pull-up speed (or the pull-up operation/rising slope) of the stack inverter INV10 becomes faster, while the pull-down speed (or pull-down operation/falling slope) thereof becomes slower. When the potential of the control node E increases, the pull-up speed of the stack inverter INV13 becomes slower, while the pull-down speed thereof becomes faster. According to such a basic principle, although the duty cycle of the output signal is changed, the changed duty cycle of the output signal converges on a 50% duty cycle through the duty cycle correction circuit 110.

In a case where an input signal IN deviating from the 50% duty cycle is applied to a phase splitter circuit 100, the duty cycles of output signals OUT and OUTN also deviate from the 50% duty cycle, as shown in FIG. 4. When the first output signal OUT is low and the second output signal is high, the PMOS transistor MP14 is turned on and the NMOS transistor MN14 is turned off. A charge provided through the PMOS transistor MP14 is charged into a feedback capacitor Cfb. When the first output signal OUT is high and the second output signal OUTN is low, the PMOS transistor MP14 is turned off and the NMOS transistor MN14 is turned on. Accordingly, the charge accumulated in the feedback capacitor Cfb is discharged through the NMOS transistor MN14. In other words, as shown in FIG. 4, the potential of the control node A is gradually reduced while the potential of the control node E is gradually increased.

Under the condition that the potential of the control node A becomes relatively low, a low-to-high transition at an internal node B is performed relatively fast in response to a high-to-low transition of the input signal IN. That is, a rising slope or a pull-up speed of an output signal B of the stack inverter INV10 is relatively increased. This means that a trip point of the inverter INV11 is advanced. Under the condition that the potential of the control node A become relatively high, a high-to-low transition at an internal node D is performed relatively fast in response to a high-to-low transition of the input signal IN (or a low-to-high transition of an output signal C of the inverter INV12). This means that a trip point of the inverter INV14 is advanced.

When the first output signal OUT is low and the second output signal is high, the PMOS transistor MP14 is turned on and the NMOS transistor MN14 is turned off. Accordingly, a charge provided through the PMOS transistor MP14 accumulates in the feedback capacitor Cfb. As compared to a previous cycle, the amount of charge accumulated in the feedback capacitor Cfb is relatively less. When the potential of the control node becomes relatively low, a high-to-low transition at the internal node B is performed relatively slowly in response to a low-to-high transition of the input signal IN. That is, the rising slope or pull-up speed of the output signal B of the stack inverter INV10 is relatively decreased. This means that the trip point of the inverter INV1 lags behind. Under the condition that the potential of the control node E becomes relatively high, a low-to-high transition at the internal node D is performed relatively slowly in response to a low-to-high transition of the input signal IN (or a high-to-low transition of the input signal C of the inverter INV12). This means that the trip point of the inverter INV14 lags behind.

As the above-described procedure is repeated, a rising transition time (or pull-up speed) of an output signal B from the stack inverter INV10 gradually becomes shorter (or faster) (h>i>j=k), as shown in FIG. 4. Accordingly, a high-to-low transition of the first output signal OUT becomes fast. That is, a high period (t1>t2>t3=t4) of the first output signal OUT is gradually reduced. Further, a falling transition time (or pull-down speed) of the output signal B from the stack inverter INV10 gradually becomes long (or slow) (a<b<c=d). Accordingly, a low-to-high transition of the first output signal OUT becomes slow. That is, the low period of the first output signal OUT is gradually increased (t5>t6>t7=t8). As a result, the high-to-low transition of the second output signal OUTN becomes slow. That is, the high period (t5<t6<t7=t8) of the second output signal OUTN becomes longer and longer. Further, the falling transition time (or pull-down speed) of an output signal D from the stack inverter INV13 becomes short (or fast). That is, a low period (t1>t2>t3=t4) of the second output signal OUTN becomes shorter and shorter.

In conclusion, although the duty cycle of the input signal IN deviates from the 50% duty cycle, the duty cycles of the output signals OUT and OUTN almost converge on the 50% duty cycle through the duty cycle correction circuit 110.

Figure 5A:
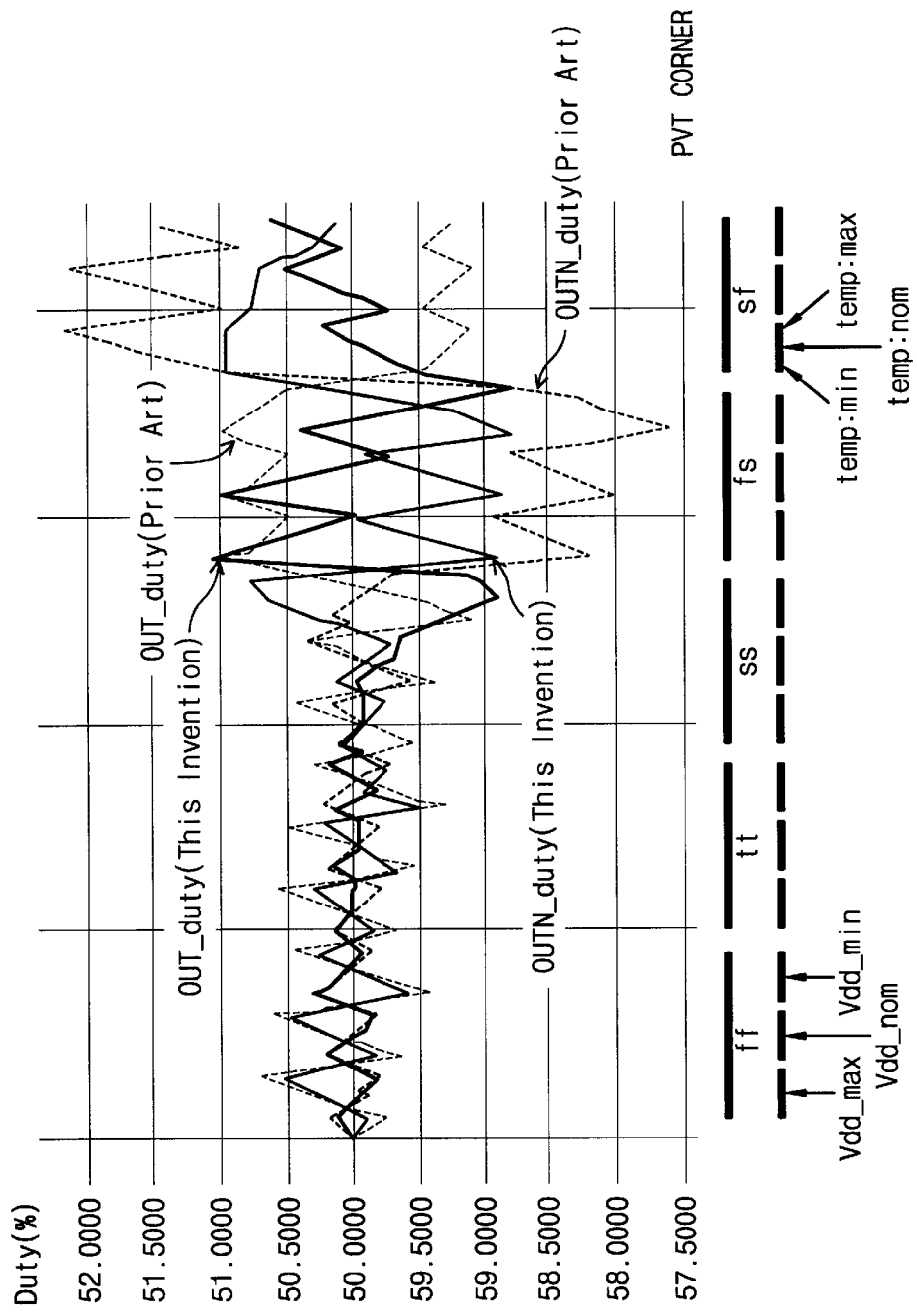
FIG. 5A and FIG. 5B are graphs for illustrating the change of a duty cycle and a skew based on PVT variations of the phase splitter circuit shown in FIG. 2.
Figure 5B:
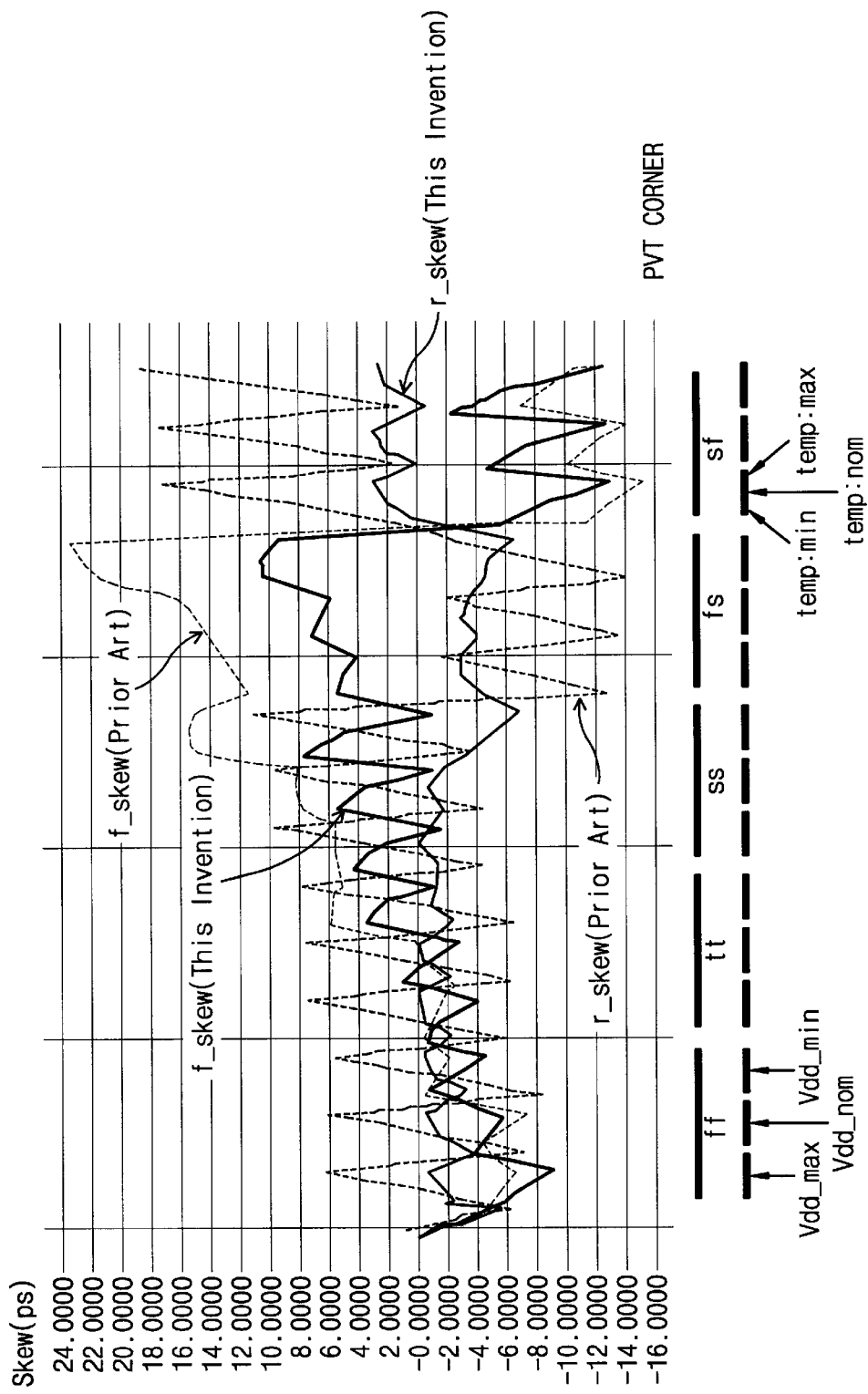

The duty cycle and skew changes based upon a PVT variation of the phase splitter circuit shown in FIG. 2 are illustrated in FIG. 5A and FIG. 5B.

In FIG. 5A and FIG. 5B, "ff", "tt", "ss", "fs", and "sf" represent different process conditions, respectively. That is, "ff" represents a process condition of a fast PMOS transistor and a fast NMOS transistor, and "tt" represents a process condition of a typical PMOS transistor and a typical NMOS transistor. Meanwhile, "ss" represents a process condition of a slow PMOS transistor and a slow NMOS transistor, "fs" represents a process condition of a fast NMOS transistor and a slow PMOS transistor, and the "sf" represents a process condition of a slow NMOS transistor and a fast PMOS transistor. Further, "Vdd_max" is approximately 2.626V, "Vdd_nom" is approximately 2.5V, and "Vdd_min" is approximately 2.25V. In addition, "temp_min" represents 0°, "temp_nom" represents approximately 55°, and "temp_max" represents approximately 110°.

In FIG. 5A, "OUT/OUTN_duty" represents a duty cycle of each output signal. As compared to output signals of a phase splitter circuit according to the prior art, output signals of a phase splitter circuit as disclosed herein have an improved duty cycle in each PVT condition. Beneficially, a duty cycle change is reduced by approximately 50% or more compared to the prior art. Particularly, in case of an asymmetric process (e.g., in case of a fast PMOS transistor and a slow NMOS transistor or in case of a slow PMOS transistor and a fast NMOS transistor) whose change is great, the phase splitter circuit as disclosed herein very efficiently controls the duty cycle. Moreover, in a case where it is hard to control the duty cycle change because of PVT noise as a signal line for transferring output signals of the phase splitter circuit becomes longer, the phase splitter circuit as discussed herein more efficiently controls the duty cycle.

In FIG. 5B, "f_skew" represents a falling skew between output signals, and "r_skew" represents a rising skew between output signals. In the case of the phase splitter circuit as disclosed herein, the skew between output signals is reduced by 50% or more, as compared to the prior art. Further, in the case of the phase splitter circuit, the skew is equivalently reduced in various PVT conditions by 50% or more. This characteristic shows that in a case where a signal line for transferring an output signal is long or short, the skew is efficiently controlled. It is apparent to those skilled in the art that the duty cycle correction circuit 110 as disclosed herein can be used as a skew correction circuit.

Figure 6:
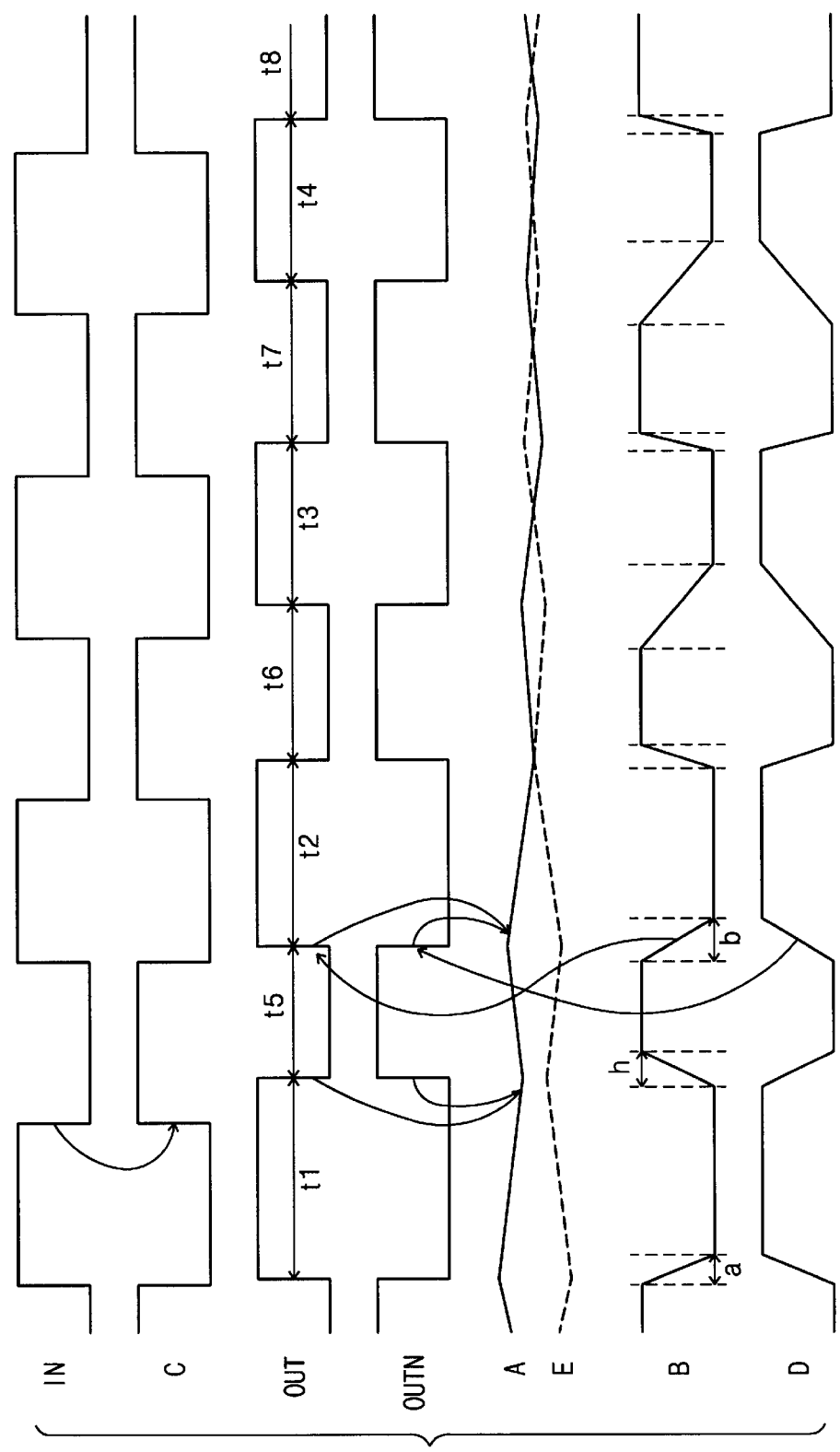
FIG. 6 is a timing diagram for explaining the steps of readjusting the duty cycle of an output signal when the duty cycle of the output signal is changed.

FIG. 6 illustrates a timing diagram for explaining the steps of readjusting the duty cycle of an output signal when the duty cycle of the output signal is changed. The duty cycle of the input signal IN is maintained at a 50% duty cycle, while the duty cycles of the output signals OUT and OUTN may deviate from the 50% duty cycle according to a PVT change or a parasitic load of a signal line. This problem is solved in the same manner as the change in the duty cycle of the input signal IN is corrected. As shown in FIG. 6, the potentials of the control nodes A and E of the duty cycle correction circuit 110 are changed in the same manner as those of FIG. 4. This means that when the duty cycle of an input or output signal is changed, a duty cycle correcting operation is performed through the same procedure. Therefore, the duty cycle correcting operation of the output signal will not be explained in further detail.

Figure 7:
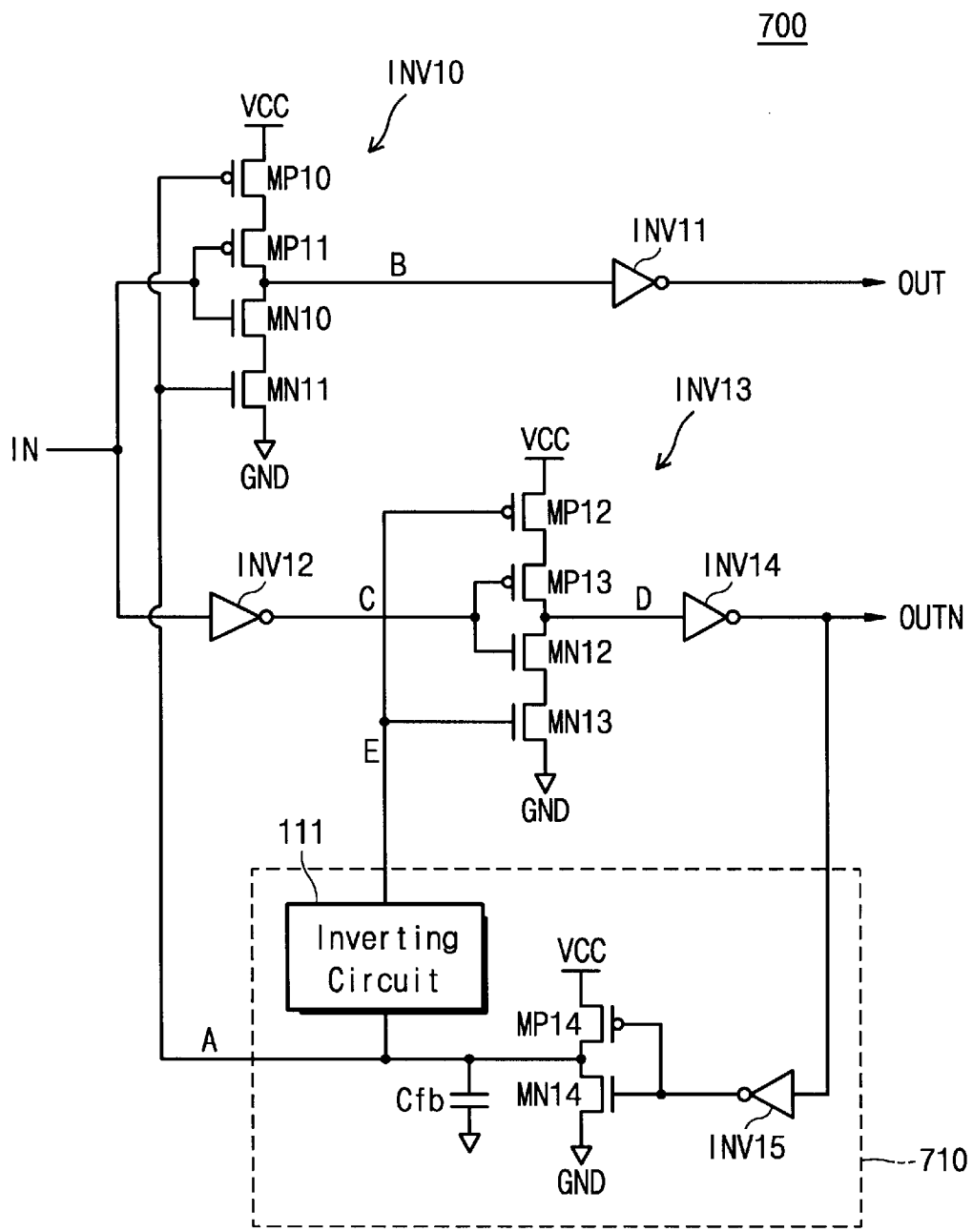
FIG. 7 through FIG. 9 are circuit diagrams of modified embodiments of the phase splitter circuit shown in FIG. 2.
Figure 8:
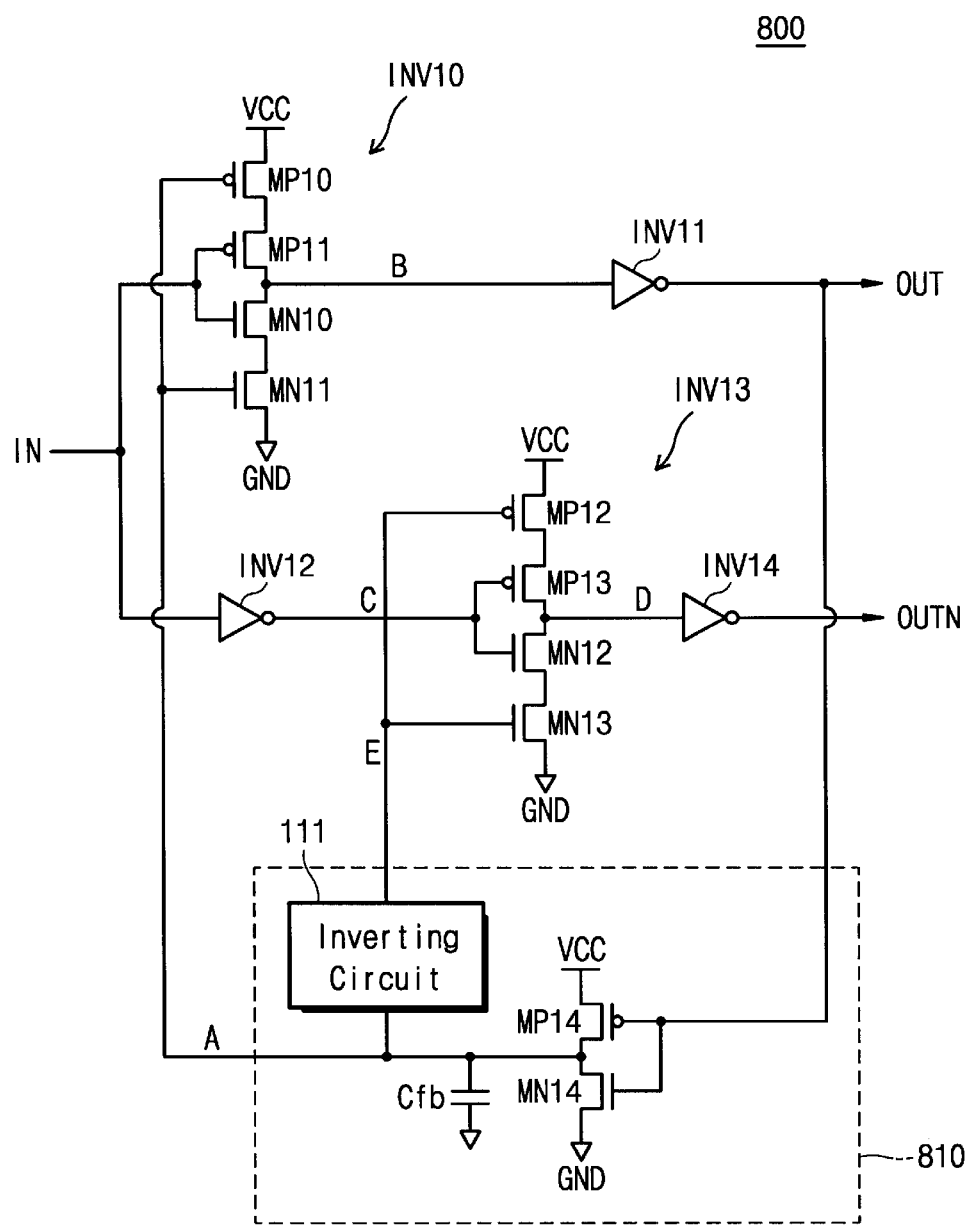
Figure 9:
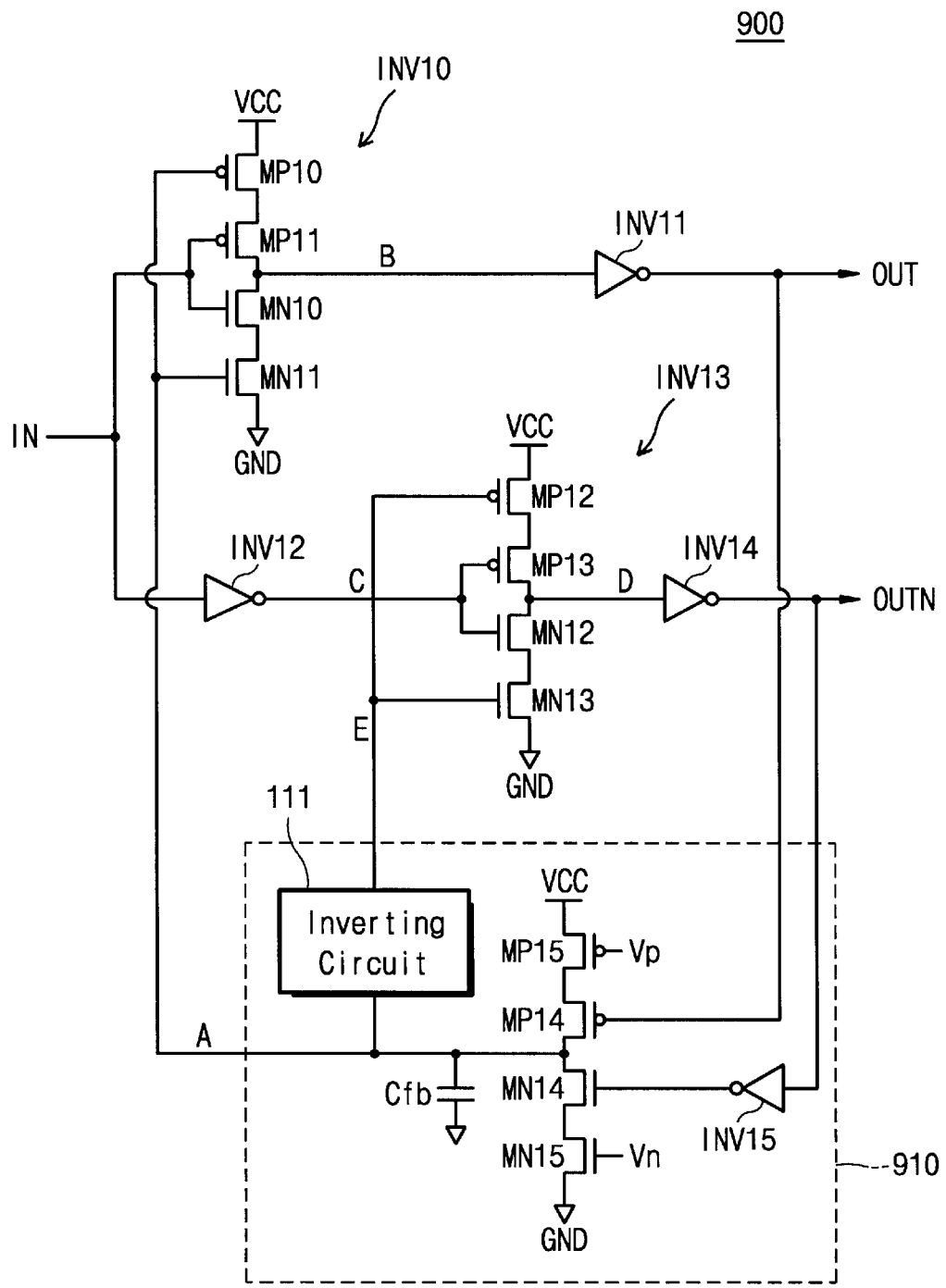

Modified examples of the phase splitter circuit shown in FIG. 2 are illustrated in FIG. 7 through FIG. 9, in which the same numerals denote the same components.

Referring now to FIG. 7, a phase splitter circuit 70 includes a duty cycle correction circuit 710 that controls stack inverters INV10 and INV13 in response to a second output signal OUTN. The duty cycle correction circuit 110 uses only one output signal to carry out a duty cycle correcting operation, which is different from that of FIG. 2. Therefore, the pull-up transistor MP14 is controlled by an output signal of an inverter INV15 (i.e., an inverted version of the second output signal OUTN) instead of the first output signal OUT. Except for this fact, the phase splitter circuit 700 of FIG. 7 operates the same as the phase splitter circuit 100 of FIG. 2. Thus, the operations of the phase splitter circuit 700 will not be explained in further detail.

In the case where only one output signal is used instead of first and second output signals OUT and OUTN, a duty cycle correction circuit 810 carries out a duty cycle correcting operation in response to a first output signal, as shown in FIG. 8. Thus, a pull-down transistor MN14 is directly controlled by the first output signal OUT. Except for this fact, the phase splitter circuit 800 of FIG. 8 operates the same as the phase splitter circuit 100 of FIG. 2.Thus, the operations of the phase splitter circuit 800 will not be explained in further detail.

In order to save the current consumed by the duty cycle correction circuit, a PMOS transistor MP15 controlled by a first control signal Vp is added between a power supply voltage VCC and the PMOS transistor MP14, as shown in FIG. 9. Further, an NMOS transistor MN15 controlled by a second control signal Vn is added between the NMOS transistor MN14 and ground voltage GND. The first and second control signals Vp and Vn are complementary and selectively activated. The PMOS and NMOS transistors MP15 and MN15 are used to reduce the power consumption of the duty cycle correction circuit 910 that may occur when a phase splitter circuit 900 is not used. Except for this fact, the phase splitter circuit 900 of FIG. 9 operates the same as the phase splitter circuit 100 of FIG. 2. Thus, the operations of the phase splitter circuit 900 will not be explained in further detail.

Figure 10:
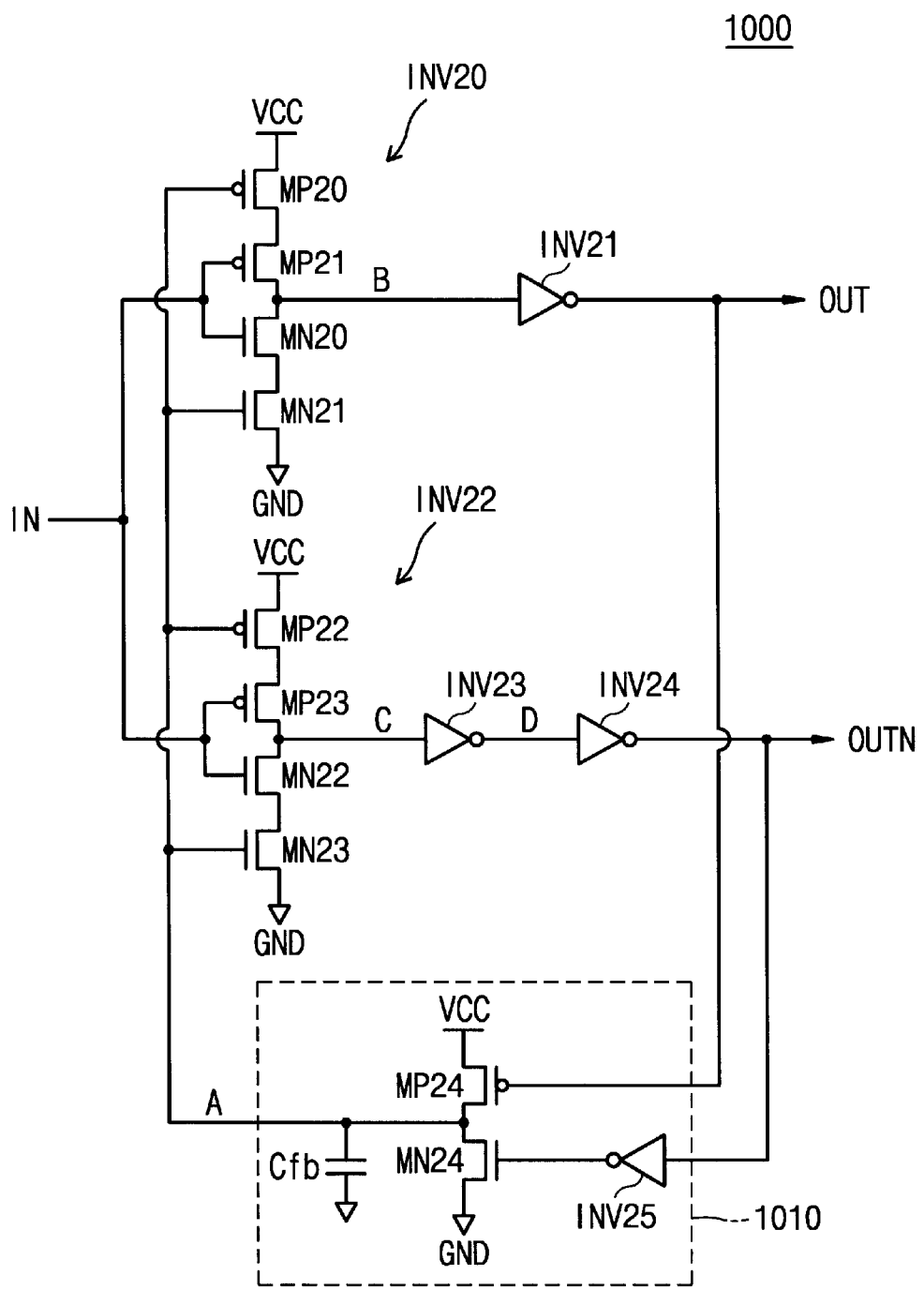
FIG. 10 is a circuit diagram of a phase splitter circuit according to a second embodiment.

A circuit diagram of a phase splitter circuit according to another embodiment is illustrated in FIG. 10.

Referring now to FIG. 10, a phase splitter circuit 1000 includes a first signal transfer path, a second signal transfer path, and a duty cycle correction circuit 1010. The first signal transfer path receives an input signal IN to output a first output signal OUT, and the second signal transfer path receives the input signal IN to output a second output signal OUTN. The first signal transfer path has inverters INV20 and INV21 that are serially coupled between the input signal IN and the first output signal OUT, and the second signal transfer path has inverters INV22, INV23, and INV24 that are serially coupled between the input signal IN and the second output signal OUTN.

In this embodiment, the inverter INV20 may be comprised of a stack inverter. The inverter INV21 may be comprised of PMOS and NMOS transistors that are coupled according to a well-known manner. The inverter INV20 includes two pull-up transistors or PMOS transistors MP20 and MP21 and two pull-down transistors or NMOS transistors MN20 and MN21. The PMOS transistors MP20 and MP21 are serially coupled between a power supply voltage VCC and an output terminal B. The NMOS transistors MN20 and MN21 are serially coupled between the output terminal B and a ground voltage GND. The PMOS and NMOS transistors MP20 and MN21 are commonly connected to a control node A of the duty cycle correction circuit 1010. The PMOS and NMOS transistors MP21 and MN20 are connected to commonly receive the input signal IN. The INV20 may be comprised of a stack inverter. Each of the inverters INV23 and INV24 may be comprised of a PMOS transistor and an NMOS transistor that are coupled according to a well-known manner. The inverter INV22 includes two pull-up transistors or PMOS transistors MP22 and MP23 and two pull-down transistors or NMOS transistors MN22 and MN23. The PMOS transistors MP22 and MP23 are serially coupled between the power supply voltage VCC and an output terminal C. The NMOS transistors MN22 and MN23 are serially coupled between the output terminal and the ground voltage GND. The PMOS and NMOS transistors MP22 and MN23 are commonly connected to the control node A of the duty cycle correction circuit 1010. The PMOS and NMOS transistors MP23 and MN22 are coupled to commonly receive the input signal IN.

Continuing to refer to FIG. 10, the duty cycle correction circuit 1010 according to this embodiment controls pull-up and pull-down speeds (or rising and falling slopes) of the stack inverters INV20 and INV22 of the first and second signal transfer paths in response to the first and second output signals OUT and OUTN. In this case, when the duty cycle of the input signal IN deviates from the 50% duty cycle and the duty cycles of the output signals OUT and OUTN deviate therefrom, a changed duty cycle of an output signal is automatically corrected by the duty cycle correction circuit 1010 to restore a 50% duty cycle.

The duty cycle correction circuit 1010 includes a pull-up or PMOS transistor MP24, a pull-down or NMOS transistor MN24, an inverter INV25, and a feedback capacitor Cfb. The pull-up transistor MP24 is coupled between the power supply voltage VCC and the control node A, and is controlled by the first output signal OUT. The pull-down transistor MN24 is coupled between the control node A and the ground voltage GND, and is controlled by the second output signal OUTN transferred through the inverter INV25. The feedback capacitor Cfb is coupled between the control node A and the ground voltage GND.

Figure 11:
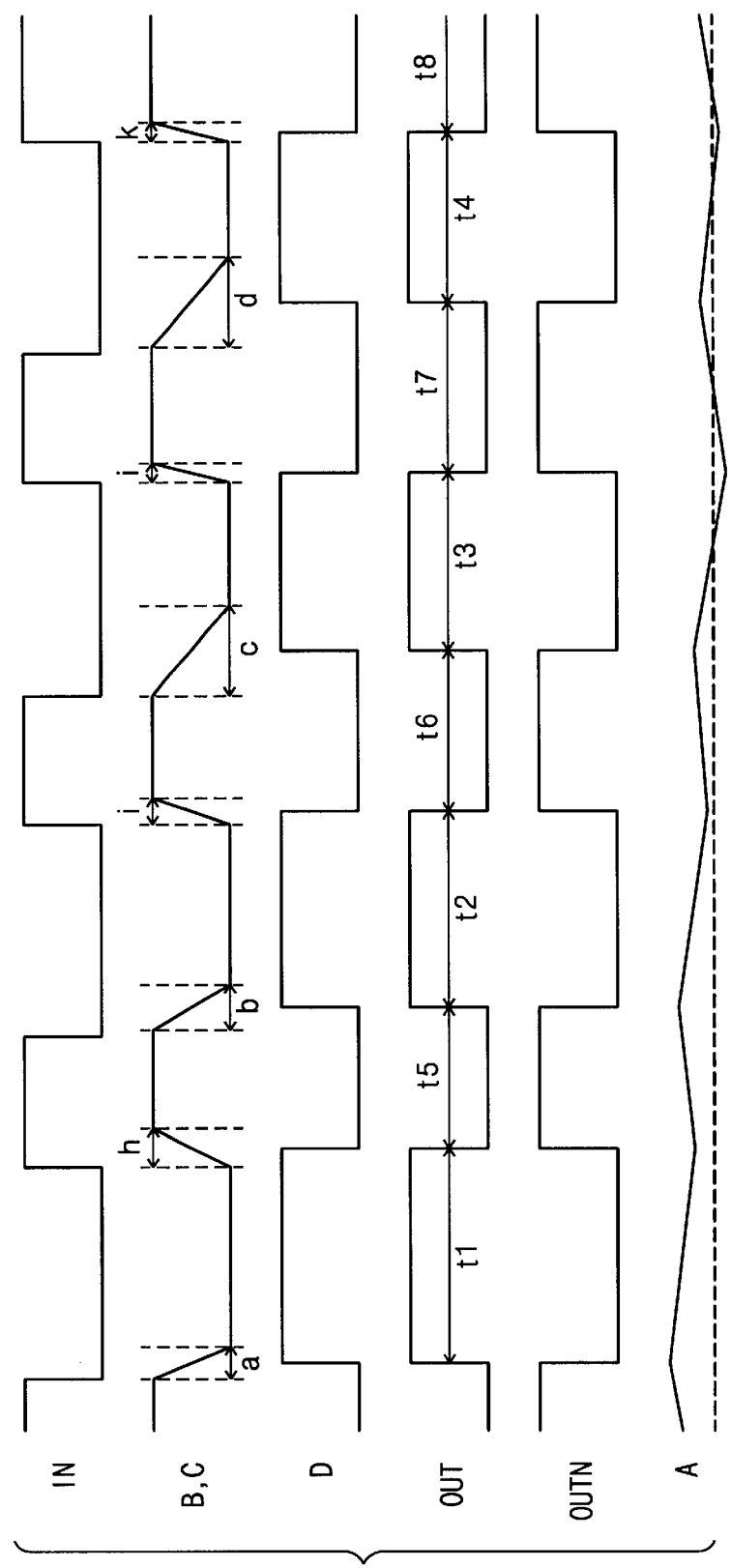
FIG. 11 is a timing diagram for explaining the steps of adjusting the duty cycle of an output signal when the duty cycle of the input signal is changed.

FIG. 11 illustrates a timing diagram for explaining the steps of adjusting a duty cycle of an output signal when the duty cycle of the input signal is changed. Operation of the phase splitter circuit 1000 according to this embodiment will now be described more fully hereinafter with reference to attached drawings.

Before explaining the operations of the phase splitter circuit, basically, when the potential of the control node is decreased, the pull-up operation becomes faster and the pull-down operation becomes slower. For example, when the potential of the control node A is decreased, the pull-up speed (or the pull-up operation/rising slope) of respective stack inverters INV20 and INV22 becomes faster while the pull-down speed (or pull-down operation/falling slope) thereof becomes slower. Based upon such a basic principle, the operations of the phase splitter circuit will be described below.

In a case where an input signal IN deviating from the 50% duty cycle is applied to the phase splitter circuit 1000, the duty cycles of the output signals OUT and OUTN also deviate therefrom, as shown in FIG. 11. When the first output signal OUT is low and the second output signal is high, the PMOS transistor MP24 is turned on and the NMOS transistor MN24 is turned off. Charge supplied through the PMOS transistor MP24 charges the feedback capacitor Cfb. When the first output signal OUT is high and the second output signal OUTN is low, the PMOS transistor MP24 is turned off and the NMOS transistor MN24 is turned on. Accordingly, the charge on Cfb is discharged through the NMOS transistor MN24. That is, the potential of the control node A is gradually decreased, as shown in FIG. 11.

Under the condition that the potential of the control node A decreases, a low-to-high transition at the respective internal nodes B and C is performed relatively faster in response to a high-to-low transition of the input signal IN. That is, a rising slope or pull-up speed of the respective output signals B and C of the stack inverters INV20 and INV22 becomes relatively higher. This means that trip points of inverters INV22 and INV23 are advanced. When the first output signal OUT is low and the second output signal OUTN is high, the PMOS transistor MP24 is turned on and the NMOS transistor MN24 is turned off. Accordingly, the charge supplied through the PMOS transistor MP24 accumulates in the feedback capacitor Cfb. As compared to a previous cycle, the amount of the charge accumulated in the feedback capacitor Cfb is less. Under the condition that the potential of the control node A decreases, a high-to-low transition at the respective internal nodes B and C is performed relatively slow in response to a low-to-high transition of the input signal IN. That is, a rising slope or a pull-up speed of the respective output signals B and C of the stack inverters INV20 and INV22 becomes slower relatively. This means that the trip points of the inverters INV21 and INV23 lag behind.

As the above-described procedure is repeated, a rising transition time (or pull-up speed) of the output signals B and C from the stack inverters INV20 and INV22 becomes shorter and shorter (or faster and faster) (h>i>j=k), as shown in FIG. 11. Accordingly, a high-to-low transition of the first output signal OUT becomes fast and a low-to-high transition of the second output signal OUTN becomes fast. That is, a high period of the first output signal OUT and a low period (t1>t2>t3=t4) of the second output signal OUTN becomes shorter and shorter. Further, a falling transition time (or pull-down speed) of the respective output signals B and C from the stack inverters INV20 and INV22 becomes longer and longer (or slower and slower) (a<b<c=d). Accordingly, a low-to-high transition of the first output signal OUT becomes slow and a high-to-low transition of the second output signal OUTN becomes slow. That is, a low period of the first output signal OUT and a high period (t5>t6>t7=t8) of the second output signal OUTN each become longer and longer. In conclusion, although the duty cycle of the input signal IN deviates from the 50% duty cycle, the duty cycles of the output signals OUT and OUTN almost converge on the 50% duty cycle through the duty cycle correction circuit 1010. In addition, as previous described, a skew between the output signals OUT and OUTN is reduced. Thus, it is apparent to those skilled in the art that the duty cycle correction circuit 1010 is used as a skew correction circuit.

Figure 12:
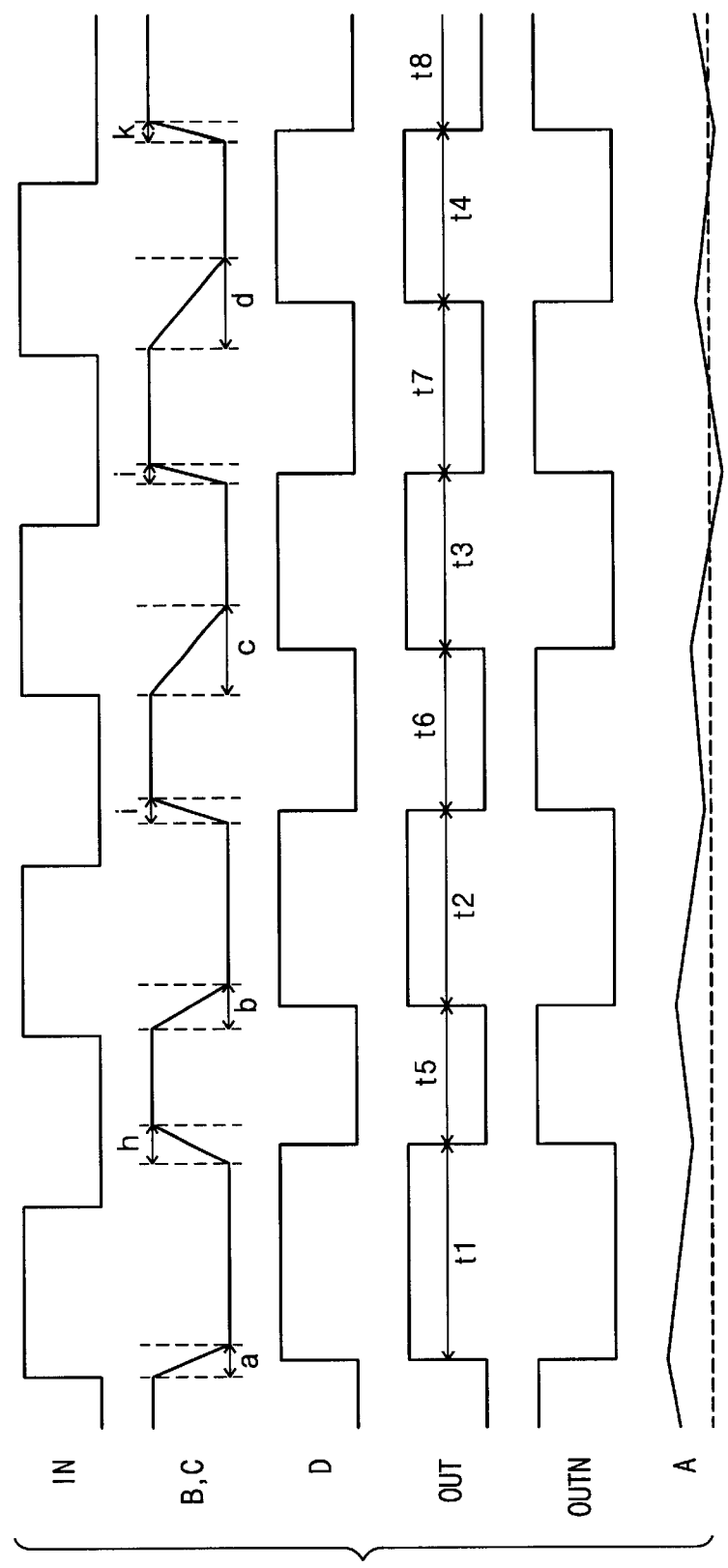
FIG. 12 is a timing diagram for explaining the steps of readjusting the duty cycle of an output signal when the duty cycle of the output signal is changed.

FIG. 12 illustrates a timing diagram for explaining the steps of readjusting the duty cycle of an output signal when the duty cycle of the output signal is changed. A duty cycle of an input signal IN is maintained at a 50% duty cycle, while duty cycles of output signals OUT and OUTN may deviate from the 50% duty cycle based upon a PVT variation or a parasitic load of a signal line. This problem is also solved in the same manner as the change in the duty cycle of the input signal IN is corrected. As can be seen in FIG. 12, the potential of a control node A of the duty cycle correction circuit 1010 is changed in the same manner as shown in FIG. 11. Therefore, the duty cycle correcting operation of an output signal will not be explained in further detail.

Figure 13:
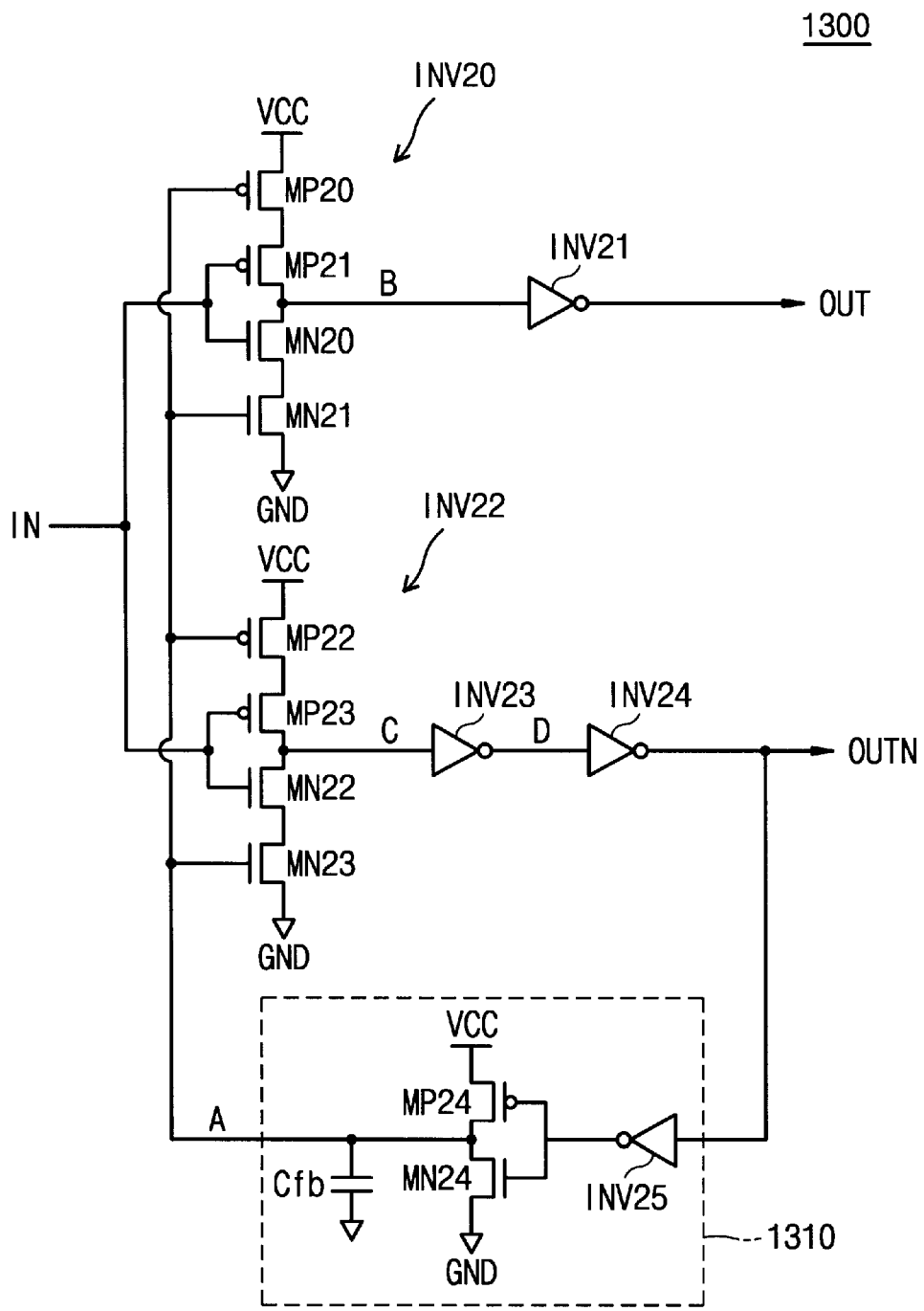
FIG. 13 through FIG. 15 are circuit diagrams of modified embodiments of the phase splitter circuit shown in FIG. 10.
Figure 14:
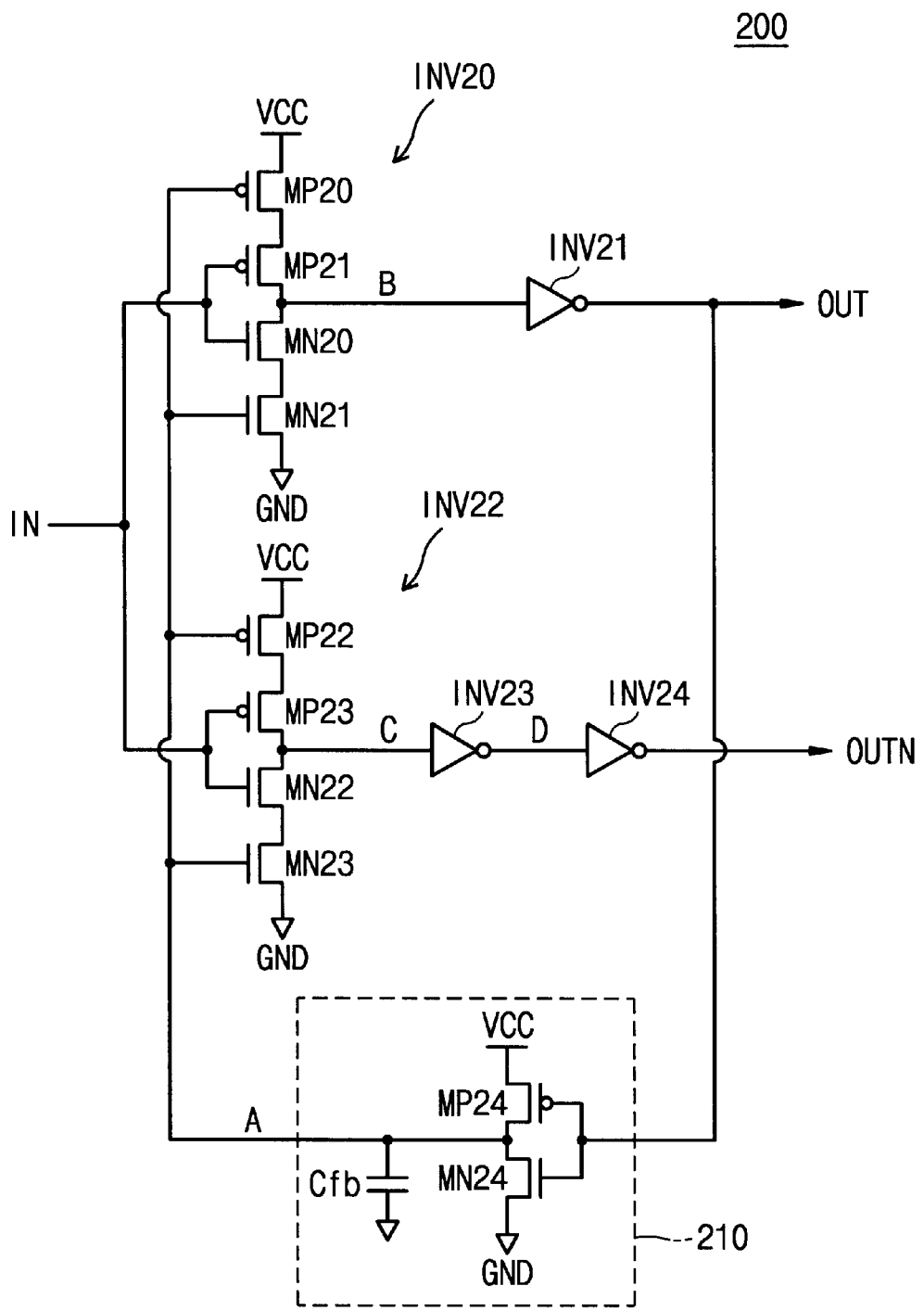
Figure 15:
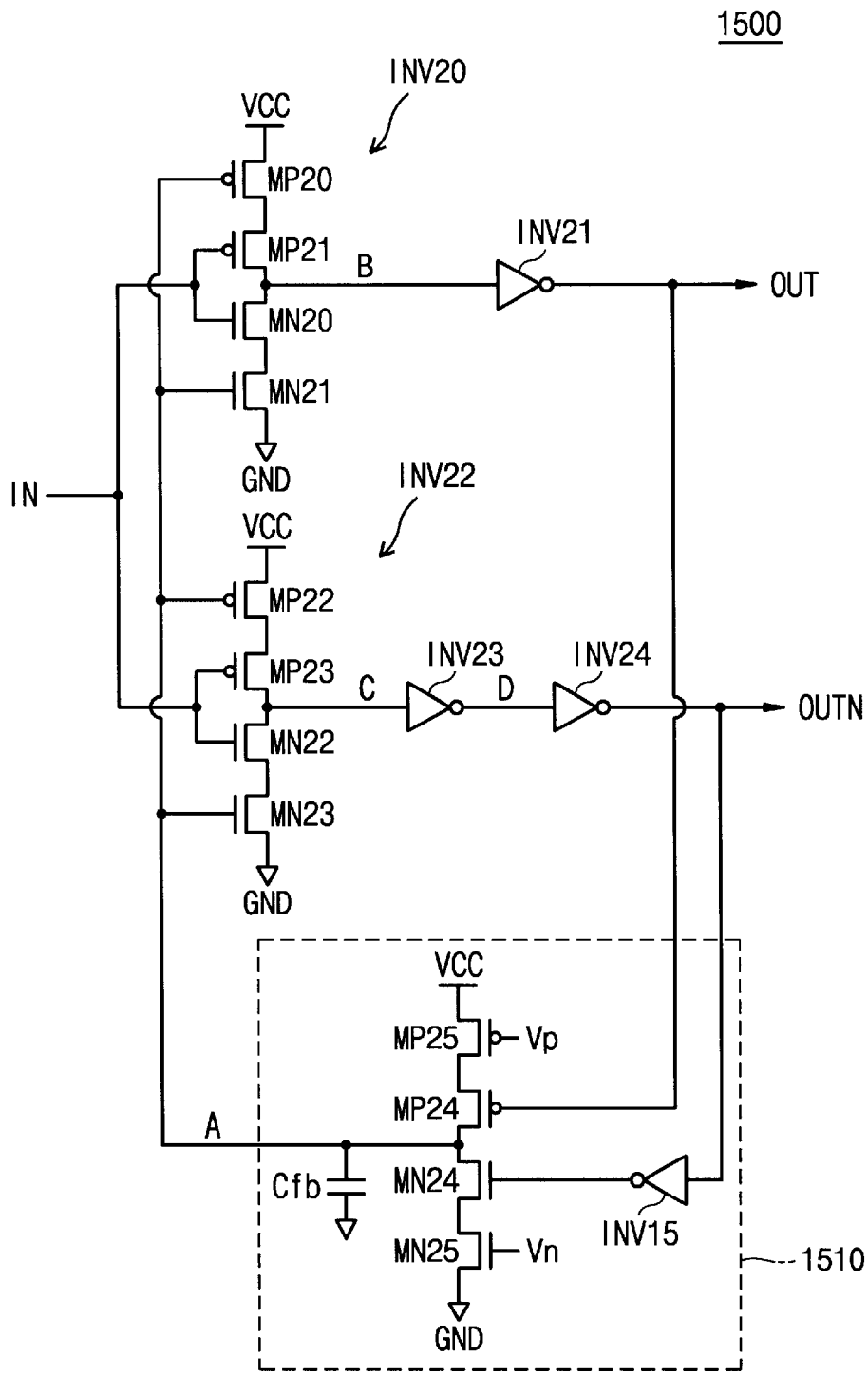

Circuit diagrams of modified examples of the phase splitter circuit shown in FIG. 10 are illustrated in FIG. 13 through FIG. 15.

In FIG. 13 through FIG. 15 and FIG. 10, components constituting first and second signal transfer paths are substantially identical to each other. Therefore, the same numerals denote the same components.

Referring now to FIG. 13, a phase splitter circuit 1300 includes a duty cycle correction circuit 1310 that controls stack inverters INV20 and INV22 in response to a second output signal OUTN. The duty cycle correction circuit 1310 of FIG. 13 uses only one output signal to carry out a duty cycle correcting operation, which is different from FIG. 10. Therefore, a pull-up transistor MP24 is controlled by an output signal of an inverter INV25 (i.e., inverted version of the second output signal OUTN) instead of a first output signal OUT. Except for this fact, the phase splitter circuit 1300 of FIG. 13 operates the same as the phase splitter circuit 1000 of FIG. 10. Thus, the operations of the phase splitter circuit of FIG. 13 will not be explained in further detail.

In a case where only one output signal is used instead of first and second output signals OUT and OUTN, a duty cycle correction circuit 1410 carries out a duty cycle correcting operation in response to a first output signal, as shown in FIG. 14. Thus, a pull-down transistor MN24 is directly controlled by the first output signal OUT. Except this fact, the phase splitter circuit 1400 of FIG. 14 operates the same as the phase splitter circuit of FIG. 10. Thus, the operations of the phase splitter circuit of FIG. 14 will not be explained in further detail.

In order to save the current consumed by the duty cycle correction circuit, a PMOS transistor MP25 controlled by a first control signal Vp is added between a power supply voltage VCC and the PMOS transistor MP24, as shown in FIG. 15. Further, an NMOS transistor MN25 controlled by a second control signal Vn is added between the NMOS transistor MN24 and a ground voltage GND. The first and second control signals are complimentary and selectively activated. The PMOS and NMOS transistors MP25 and MN25 save a current consumption of the duty cycle correction circuit 1510 that may occur when a phase splitter circuit 1500 is not used. Except this fact, the phase splitter circuit of FIG. 15 operates the same as the phase splitter circuit of FIG. 10. Therefore, the operations of the phase splitter circuit of FIG. 15 will not be explained in further detail.

As explained so far, duty cycle data of output signals is used to control pull-up/pull-down speeds of a signal transfer path. Thus, when a duty cycle of an input signal is changed and/or duty cycles of the output signals are changed, changed duty cycles of the output signals are automatically corrected back to a 50% duty cycle. Further, skew between the output signals is minimized.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

What is claimed is:

1. A phase splitter circuit comprising:
   a first signal transfer path for receiving an input signal to output a first output signal;
   a second signal transfer path for receiving the input signal to output a second output signal with an inverted phase with respect to the first output signal; and
   a duty cycle correction circuit operating responsive to the first and second output signals,
   wherein the duty cycle correction circuit controls pull-up and pull-down speeds of the first and second signal transfer paths to opposite directions in response to the first and second output signals so that each of the first and second output signals has a half duty cycle when a duty cycle of the input signal or of the respective first and second output signals deviates from the half duty cycle.

2. The phase splitter circuit of claim 1, wherein the input signal is one selected from a clock signal and a data signal.

3. The phase splitter circuit of claim 1, wherein the first signal transfer path comprises first and second inverters that are serially coupled between the input signal and the first output signal, and the second signal transfer path comprises third, fourth, and fifth inverters that are serially coupled between the input signal and the second output signal.

4. The phase splitter circuit of claim 3, wherein the duty cycle correction circuit charges or discharges a control node in response to the first and second output signals, and pull-up and pull-down speeds of the first inverter are adjusted according to a potential of the control node, and pull-up and pull-down speeds of the fourth inverter are adjusted according to an inverted potential of the control node.

5. The phase splitter circuit of claim 4, wherein the duty cycle correction circuit adjusts the pull-up speed of the first inverter in an increasing direction and the pull-down speed of the first inverter in a decreasing direction when the potential of the control node is lowered relative to a previous potential thereof; and
   wherein the duty cycle correction circuit adjusts the pull-up speed of the fourth inverter in the decreasing direction and the pull-down speed of the fourth inverter in the increasing direction when the inverted potential of the control node is increased relative to a previous potential thereof.

6. The phase splitter circuit of claim 5, wherein the first and fourth inverters comprises a stack inverter having first pull-up and pull-down transistors controlled by the potential of the control node and second pull-up and pull-down transistors controlled by an input signal of a corresponding inverter.

7. The phase splitter circuit of claim 6, wherein when a potential of the control node is relatively decreased and the input signal transitions from a low level to a high level, a high-to-low transition of an output signal of the first inverter becomes relatively slower, and when a potential of the control node is relatively decreased and the input signal transitions from the high level to the low level, a low-to-high transition of the output signal of the first inverter becomes relatively faster.

8. The phase splitter circuit of claim 6, wherein when an inverted potential of the control node is relatively increased and an input signal of the fourth inverter transitions from a high level to a low level, a low-to-high transition of an output signal of the fourth inverter becomes relatively slower, and when the inverted potential of the control node is relatively decreased and the input signal of the fourth inverter transitions from the low level to the high level, a high-to-low transition of the output signal of the fourth inverter becomes relatively faster.

9. The phase splitter of claim 4, wherein the duty cycle correction circuit comprises:
 a pull-up transistor for pulling up the control node in response to the first output signal;
 a pull-down transistor for pulling down the control node in response to an inverted version of the second output signal;
 a feedback capacitor coupled between the control node and ground voltage; and
 an inverting amplifier for inverting a potential of the control node to output the inverted potential of the control node.

10. The phase splitter circuit of claim 4, wherein the duty cycle correction circuit comprises:
 first and second pull-up transistors for pulling up the control node in response to the first output signal and a first control signal, the first and second pull-up transistors being serially coupled between a power supply voltage and the control node;
 first and second pull-down transistors for pulling down the control node in response to an inverted version of the second output signal and a second control signal, the first and second pull-down transistors being serially coupled between the power supply voltage and the control node;
 a feedback capacitor coupled between the control node and the ground voltage; and
 an inverting amplifier for inverting a potential of the control node to output the inverted potential of the control node.

11. The phase splitter circuit of claim 3, wherein the duty cycle correction circuit charges or discharges a control node in response to the first and second output signals, and the pull-up and pull-down speeds of the respective first and third inverters are adjusted according to the potential of the control node.

12. The phase splitter of claim 11, wherein the duty cycle correction circuit adjusts the pull-up speed of the respective first and second inverters in an increasing direction and the pull-down speed of the respective first and third inverters in a decreasing direction when the potential of the control node is reduced relative to a previous potential thereof.

13. The phase splitter circuit of claim 11, wherein the first and third inverters comprise a stack inverter having first pull-up and pull-down transistors controlled by the potential of the control node and second pull-up and pull-down transistors controlled by an input signal of a corresponding inverter.

14. The phase splitter circuit of claim 13, wherein when a potential of the control node is relatively decreased and the input signal transitions from a low level to a high level, a high-to-low transition of an output signal of the respective first and third inverters becomes relatively slower, and when a potential of the control node is relatively reduced and the input signal transitions from the high level to the low level, a low-to-high transition of the output signal of the respective first and third inverters becomes relatively faster.

15. The phase splitter circuit of claim 11, wherein the duty cycle correction circuit comprises:
 a pull-up transistor for pulling up the control node in response to the first output signal;
 a pull-down transistor for pulling down the control node in response to an inverted version of the second output signal; and
 a feedback capacitor coupled between the control node and a ground voltage.

16. The phase splitter circuit of claim 11, wherein the duty cycle correction circuit comprises:
 first and second pull-up transistors for pulling up the control node in response to the first output signal and a first control signal, the first and second pull-up transistors being serially coupled between a power supply voltage and the control node;
 first and second pull-down transistors for pulling down the control node in response to an inverted version of the second output signal and a second control signal, the first and second pull-down transistors being serially coupled between the control node and a ground voltage; and
 a feedback capacitor coupled between the control node and the ground voltage.

17. A phase splitter circuit comprising:
 a first stack inverter for inverting an input signal;
 a first inverter for inverting an output signal of the first stack inverter to output a first output signal;
 a second inverter for inverting the input signal;
 a second stack inverter for inverting an output signal of the second inverter;
 a third inverter for inverting an output signal of the second stack inverter to output a second output signal; and
 a duty cycle correction circuit for controlling the first and second stack inverters in response to the first and second output signals,
 wherein the duty cycle correction circuit controls pull-up and pull-down speeds of the first and second stack inverters in opposite directions in response to the first and second output signals so that each of the first and second output signals has a half duty cycle when a duty cycle of the input signal or of the respective first and second output signals deviates from the half duty cycle.

18. The phase splitter circuit of claim 17, wherein the duty cycle correction circuit comprises:
 a pull-up transistor for pulling up the control node in response to the first output signal;
 a pull-down transistor for pulling down the control node in response to an inverted version of the second output signal;
 a feedback capacitor coupled between the control node and a ground voltage; and
 an inverting amplifier for inverting a potential of the control node to output the inverted potential of the control node.

19. The phase splitter circuit of claim 17, wherein the duty cycle correction circuit comprises:
 first and second pull-up transistors for pulling up the control node in response to the first output signal and a first control circuit, the first and second pull-up transistors being serially coupled between a power supply voltage and the control node;

first and second pull-down transistors for pulling down the control node in response to an inverted version of the second output signal and a second control signal, the first and second pull-down transistors being serially coupled between the control node and a ground voltage;

a feedback capacitor coupled between the control node and the ground voltage; and an inverting amplifier for inverting a potential of the control node to output the inverted potential of the control node.

20. A phase splitter comprising:

a first stack inverter for inverting an input signal;

a first inverter for inverting an output signal of the first stack inverter to output a first output signal;

a second stack inverter for inverting the input signal;

a second inverter for inverting an output signal of the second stack inverter;

a third inverter for inverting an output signal of the second inverter to output a second output signal; and a duty cycle correction circuit for controlling the first and second stack inverters in response to the first and second output signals, wherein the duty cycle correction circuit controls pull-up and pull-down speeds of the first and second stack inverters in opposite directions in response to the first and second output signals so that each of the first and second output signals has a half duty cycle when a duty cycle of the input signal or of the respective first and second output signals deviates from the half duty cycle.

21. The phase splitter circuit of claim 20, wherein the duty cycle correction circuit comprises:

a pull-up transistor for pulling the control node in response to the first output signal;

a pull-down transistor for pulling down the control node in response to an inverted version of the second output signal; and a feedback capacitor coupled between the control node and a ground voltage.

22. The phase splitter circuit of claim 20, wherein the duty cycle correction circuit comprises:

first and second pull-up transistors for pulling up the control node I response to the first output signal and a first control signal, the first and second pull-up transistors being serially coupled between a power supply voltage and the control node;

first and second pull-down transistors for pulling down the control node in response to an inverted version of the second output signal and a second control signal, the first and second pull-down transistors being serially coupled between the control node and a ground voltage; and a feedback capacitor coupled between the control node and the ground voltage.

23. A phase splitter circuit comprising:

a first stack inverter for inverting an input signal;

a first inverter for inverting an output signal of the first stack inverter to output a first output signal;

a second inverter for inverting the input signal;

a second stack inverter for inverting an output signal of the second inverter;

a third inverter for inverting an output signal of the second stack inverter to output a second inverter; and a duty cycle correction circuit for controlling the first and second stack inverters in response to either one of the first and second output signals, wherein the duty cycle correction circuit controls pull-up and pull-down speeds of the first and second stack inverters in opposite directions in response to either one of the first and second output signals so that each of the first and second output signals has a half duty cycle when a duty cycle of the input signal or of the respective first and second output signals deviates from the half duty cycle.

24. The phase splitter circuit of claim 23, wherein the duty cycle correction circuit comprises:

a pull-up transistor for pulling up the control node in response to the first output signal;

a pull-down transistor for pulling down the control node in response to the first output signal;

a feedback capacitor coupled between the control node and a ground voltage; and an inverting amplifier for inverting a potential of the control node to output the inverted potential of the control node.

25. The phase splitter circuit of claim 23, wherein the duty cycle correction circuit comprises:

a pull-up transistor for pulling up the control node in response to an inverted version of the second output signal;

a pull-down transistor for pulling down the control node in response to the inverted version of the second output signal;

a feedback capacitor coupled between the control node and a ground voltage; and an inverting amplifier for inverting a potential of the control node to output the inverted potential of the control node.

26. A phase splitter circuit comprising:

a first stack inverter for inverting an input signal;

a first inverter for inverting an output signal of the first stack inverter to output a first output signal;

a second stack inverter for inverting the input signal;

a second inverter for inverting an output signal of the second stack inverter;

a third inverter for inverting an output signal of the second inverter to output a second output signal; and a duty cycle correction circuit for controlling the first and second stack inverter in response to either one of the first and second output signals, wherein the duty cycle correction circuit controls pull-up and pull-down speeds of the first and second stack inverters in opposite directions in response to either one of the first and second output signals so that each of the first and second output signals has a half duty cycle when a duty cycle of the input signal or of the respective first and second output signals deviates from the half duty cycle.

27. The phase splitter circuit of claim 26, wherein the duty cycle correction circuit comprises:

a pull-up transistor for pulling up the control node in response to the first output signal;

a pull-down transistor for pulling down the control node in response to the first output signal; and a feedback capacitor coupled between the control node and a ground voltage.

28. The phase splitter circuit of claim 26, wherein the duty cycle correction circuit comprises:

a pull-up transistor for pulling up the control node in response to an inverted version of the second output signal;

a pull-down transistor for pulling down the control node in response to the inverted version of the second output signal; and a feedback capacitor coupled between the control node and a ground voltage.

* * * * *